United States Patent
Smith et al.

(10) Patent No.: US 7,285,990 B1
(45) Date of Patent: Oct. 23, 2007

(54) HIGH-PRECISION BUFFER CIRCUIT

(75) Inventors: Steven O. Smith, Brownfield, ME (US); Dale S. Wedel, Loveland, CO (US)

(73) Assignee: Fairchild Semiconductor Corporation, South Portland, ME (US)

( * ) Notice: Subject to any disclaimer, the term of this patent is extended or adjusted under 35 U.S.C. 154(b) by 120 days.

(21) Appl. No.: 10/757,115

(22) Filed: Jan. 14, 2004

(51) Int. Cl.
*H03K 3/00* (2006.01)

(52) U.S. Cl. ............... 327/108; 327/109; 327/110; 327/111; 327/112; 327/538; 326/82; 326/83; 326/84; 326/85; 326/86

(58) Field of Classification Search ............ 327/108, 327/82, 83, 84, 85, 86, 87, 88, 89, 90, 91; 326/82, 83, 84, 85, 86, 87, 88, 89, 90, 91
See application file for complete search history.

(56) References Cited

U.S. PATENT DOCUMENTS

| | | | | |
|---|---|---|---|---|
| 5,592,121 A | * | 1/1997 | Jung et al. | 327/541 |
| 6,066,985 A | * | 5/2000 | Xu | 330/253 |
| 6,137,360 A | * | 10/2000 | Memida | 330/253 |
| 6,163,218 A | * | 12/2000 | Hashimoto et al. | 330/257 |
| 6,498,334 B2 | * | 12/2002 | Feng | 250/214 A |
| 2007/0080723 A1 | * | 4/2007 | Lee et al. | 327/112 |

* cited by examiner

*Primary Examiner*—Tuan T. Lam
*Assistant Examiner*—Hiep Nguyen
(74) *Attorney, Agent, or Firm*—Sidley Austin LLP

(57) ABSTRACT

A buffer circuit includes an input terminal operable to receive an input signal and an output terminal at which an output signal for the buffer circuit is provided. In the buffer circuit, three transistors at most provide signal currents. Two of the three transistors can be matched. Means are provided for feeding back the output signal so that the two matched transistors are balanced in response to a change in the input signal appearing at the input terminal.

20 Claims, 5 Drawing Sheets

HIGH-PRECISION BUFFER CIRCUIT

TECHNICAL FIELD OF THE INVENTION

This invention relates to circuitry, and more particularly, to a high-precision buffer circuit.

BACKGROUND

In many electrical and electronic devices, buffer circuits are used to buffer and amplify data signals. Buffer circuits ideally should provide an output signal that is precisely follows the input.

SUMMARY

According to an embodiment of the present invention, a buffer circuit includes an input terminal operable to receive an input signal and an output terminal at which an output signal for the buffer circuit is provided. A first transistor, having a gate, a source, and a drain, is connected at its source to the input terminal. A second transistor has a gate, a source, and a drain. The gate of the second transistor is connected to its drain and to the gate of the first transistor. A third transistor, having a gate, a source, and a drain, is connected at its gate to the drain of the first transistor. The source of the third transistor is connected to the output terminal and to the source of the second transistor. Means are provided for balancing the first transistor and the second transistor when a change occurs in the input signal appearing at the input terminal.

According to another embodiment of the present invention, a buffer circuit includes an input terminal operable to receive an input signal and an output terminal at which an output signal for the buffer circuit is provided. In the buffer circuit, three transistors at most provide signal currents. Two of the three transistors can be matched. Means are provided for feeding back the output signal so that the two matched transistors are balanced in response to a change in the input signal appearing at the input terminal.

Important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

The embodiments of the present invention and their advantages are best understood by referring to FIGS. 1A through 4 of the drawings. Like numerals are used for like and corresponding parts of the various drawings.

Figure 1A:
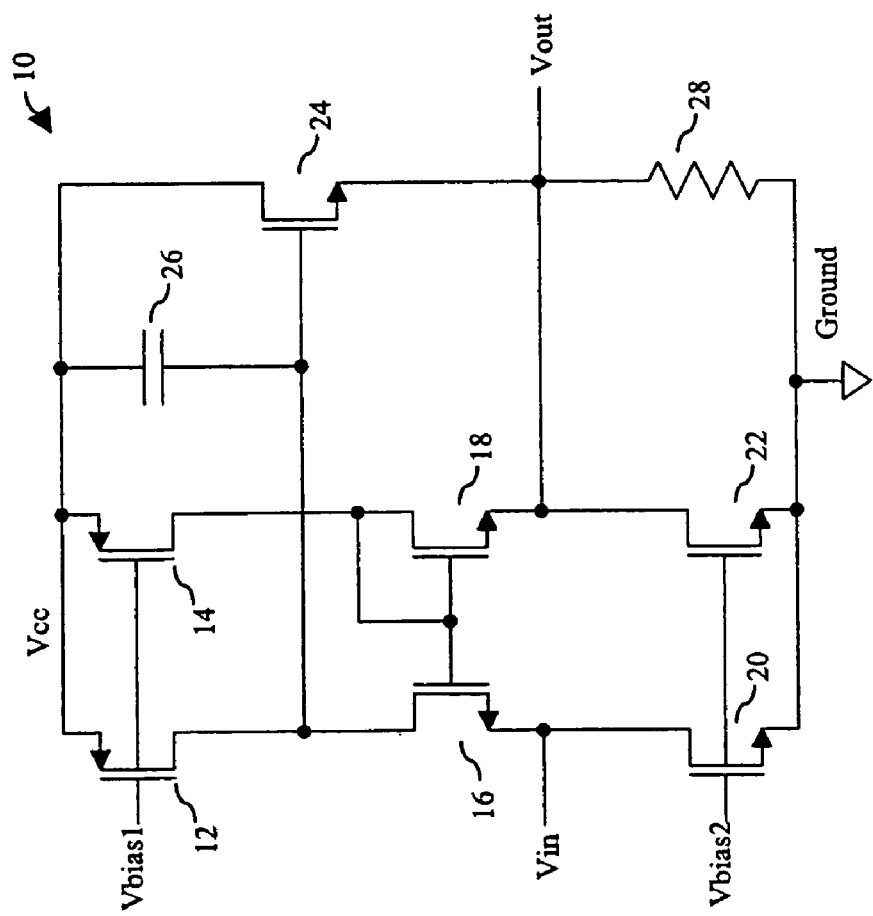
FIGS. 1A and 1B are schematic diagrams of one implementation for a high-precision buffer circuit, according to an embodiment of the present invention.
Figure 1B:
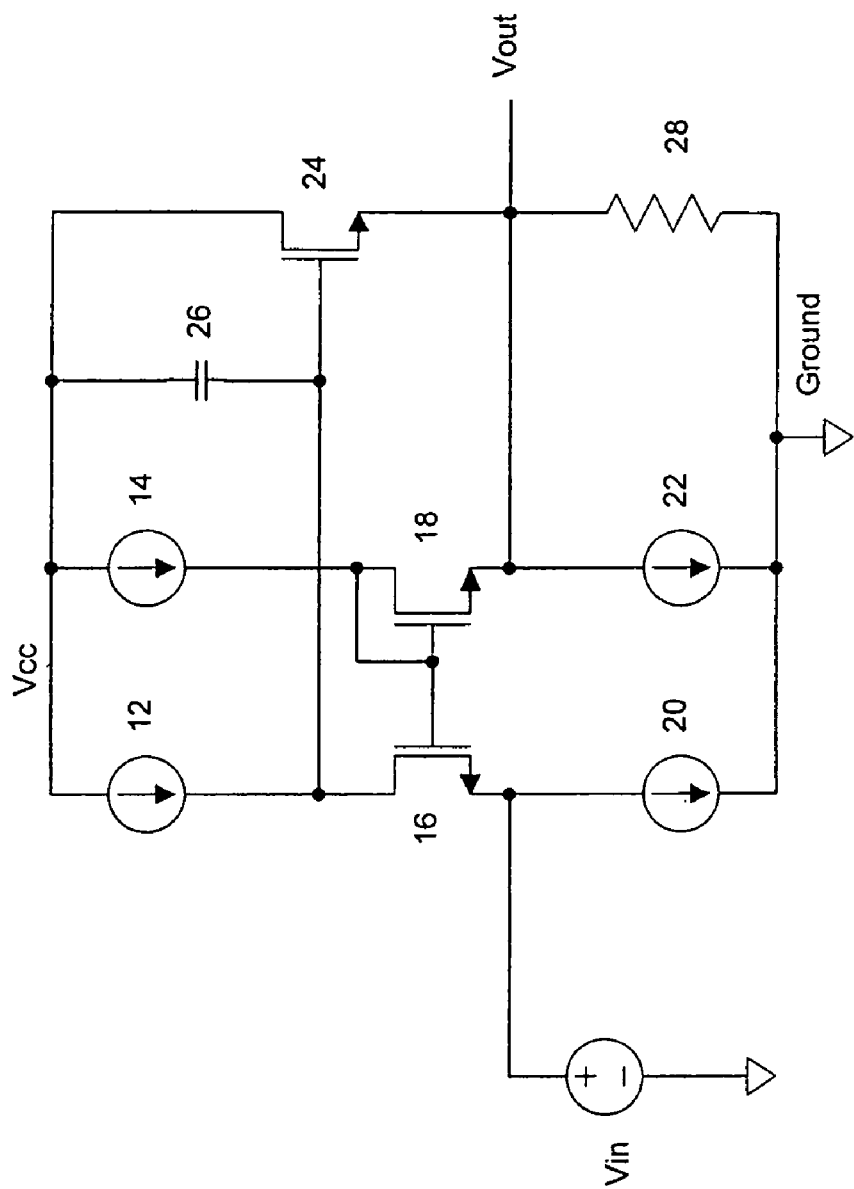

FIG. 1 is a schematic diagram of one implementation for a high-precision buffer circuit 10, according to an embodiment of the present invention. High-precision buffer circuit 10 generally functions to receive an input and to drive an output in response. Buffer circuit 10 allows for high input impedance and provides for low output impedance. As depicted, buffer circuit 10 comprises transistors 12, 14, 16, 18, 20, 22, and 24, and capacitor 26. A resistor 28 can be an external component connected at the output of the buffer circuit 10. Transistors 12, 14, 16, 18, 20, 22, and 24 can be implemented with any suitable transistor devices, such as metal-oxide-semiconductor field effect transistors (MOSFETs, which can be NMOS or PMOS) or bipolar junction transistors (BJTs).

Transistors 12, 14 are a first transistor pair and can be, for example, PMOS transistors. Transistors 12 and 14 are connected to a voltage source Vcc at their sources and may receive a first bias signal Vbias1 at their gates. The first bias signal Vbias1 can have a value below voltage source Vcc, for example, 0.5-1.5 V less than Vcc. In one embodiment, transistors 12 and 14 can be matched so that any change in the drain-source voltage of transistor 12 is offset by a change in the drain-source voltage of transistor 14. During operation, transistors 12 and 14 may provide relatively constant current and, as such, can be considered or alternatively implemented as current sources.

Transistors 16, 18 can be a second transistor pair and may be implemented using NMOS transistors. The second transistor pair comprising transistors 16, 18 are connected to the first transistor pair 12, 14. In particular, in one embodiment, the drains of transistors 16 and 18 are connected to the drains of transistors 12 and 14, respectively. Transistors 16 and 18 may form a current mirror. That is, the gates of transistors 16 and 18 are connected together. The drain of transistor 18 is connected to its gate and the drain of transistor 14. Transistor 14 provides bias current to transistor 18. When operating, precision buffer circuit 10 is designed to balance transistors 16 and 18. As described herein, this can be accomplished with feedback from an output terminal of the buffer circuit 10.

Transistors 20, 22 can be a third transistor pair and may be implemented using NMOS transistors. The third transistor pair comprising transistors 20, 22 are connected to the second transistor pair 16, 18. In particular, in one embodiment, the drains of transistors 20 and 22 are connected to the sources of transistors 12 and 14, respectively. Transistors 20 and 22 are connected to ground GND at their sources and may receive a second bias signal Vbias2 at their gates. The second bias signal Vbias2 can have a value higher than ground GND, for example, 0.5-1.5 V more than ground GND. In one embodiment, transistors 20 and 22 can be matched so that any change in the drain-source voltage of transistor 20 is offset by a change in the drain-source voltage of transistor 22. During operation, transistors 20 and 22 may provide relatively constant current and, as such, can be considered or alternatively implemented as current sources. In some embodiments, transistor 22 is designed to provide current with a value that is a multiple (e.g., 2×) of the current provided by transistor 20.

An input terminal for the high-precision buffer circuit 10 can be a node between transistors 16 and 20. The input terminal may receive an input signal Vin. The input signal Vin may change the source voltage Vs of transistor 16. The output terminal for the circuit 10 can be at the source of transistor 24 (which is also a node between transistors 18 and 22). An output signal Vout may be provided at the output terminal. The output signal Vout can be fed back to the input for system 10. This can be accomplished via transistors 18 and 16, which are balanced in the process. In this embodiment, due to the connection of the output terminal to the source of transistor 18, the output signal Vout may change the source voltage of transistor 18.

Transistor 24, which may be implemented as an NMOS transistor, is connected to voltage source VCC at its drain and to the drain of transistor 16 at its gate. The node at the gate of transistor 24 may be considered the high-impedance node for precision buffer circuit 10 and is the node with the highest gain in the circuit. The source of transistor 24 is connected to the output terminal. Transistor 24 can function to source current to the output terminal, thus providing pull-up capability. Capacitor 26 is connected to a fixed node (such as, for example, Vcc (shown) or Ground) and the gate of transistor 24. Capacitor 26 can function as a compensation capacitor to prevent or minimize oscillation at the gate of transistor 24. Capacitor 26 may have a value of 50 f, in one embodiment.

In operation, assuming an initial steady state for precision buffer circuit 10, an increase or rise in the input signal Vin at the input terminal (within a given operational range of slew rate ($\Delta V/\Delta t$)) causes the gate-source voltage Vgs of transistor 16 to decrease. The slew rate $\Delta V/\Delta t$ may have a value equal to the quiescent current flowing in transistor 16 divided by the value of capacitor 26. Accordingly, less current flows through transistor 16. This causes the voltage at the gate of transistor 24 to increase, and thus, more current flows through transistor 24. This pulls up the voltage at the output terminal. Thus, the output signal Vout increases in response to an increase in the input signal Vin. Transistor 14 sources current to transistor 18, and thus transistor 18 may have a relatively fixed gate-source voltage Vgs. The increased voltage at the output terminal causes the source voltage Vs of transistor 18 to increase, thereby causing the gate voltages Vg of transistors 18 and 16 to increase. This causes the gate-source Vgs voltage of transistor 16 to increase. Thus, transistors 16 and 18 are brought into balance again for steady state.

Alternatively, again assuming an initial steady state for precision buffer circuit 10, a decrease or drop in the input signal Vin at the input terminal (within a given operational range of $\Delta V/\Delta t$) causes the gate-source voltage Vgs of transistor 16 to increase. Accordingly, more current flows through transistor 16. This causes the voltage at the gate of transistor 24 to decrease, and thus, less current flows through transistor 24. This causes the voltage at the output terminal to decrease. Transistor 14 sources current to transistor 18, and thus transistor 18 may have a relatively fixed gate-source voltage Vgs. The decreased voltage at the output terminal causes the source voltage Vs of transistor 18 to decrease, thereby causing the gate voltages Vg of transistors 18 and 16 to decrease. This causes the gate-source voltage Vgs of transistor 16 to decrease. Thus, transistors 16 and 18 are brought into balance again for steady state.

In precision buffer circuit 10, in some embodiments, only transistors 16, 18, and 24 are conducting signal currents. The remaining transistors—i.e., transistors 12, 14, 20, and 22—are conducting only bias currents, thus operating to provide relatively constant current. As such, precision buffer circuit 10 may provide faster operation within a given operational range of $\Delta V/\Delta t$ for the input signal Vin compared to previously designed buffer circuits which have more transistors or components providing signal currents.

In addition, the precision buffer circuit 10 may be advantageous over previously developed designs because it eliminates or substantially reduces the open loop gain limiting effects of transistor source-drain resistance Rout by matching. In particular, a transistor may have a source-drain resistance Rout that is a function of the drain-source voltage Vds of the transistor. With previously developed designs, such source-drain resistance Rout caused error by limiting the gain at a high impedance node. In the precision buffer circuit 10, however, the respective drain-source voltages Vds of transistors 16 and 18 are approximately fixed. The respective drain-source voltages Vds of transistors 12, 14, 20, and 22 change as the input signal changes, but their effects cancel due to the matching of transistors 12 and 14 and the matching of transistors 20 and 22—i.e., the effects in transistor 14 cancels those in transistor 12, and the effects in transistor 20 cancels those in transistor 22. As such, the precision buffer circuit 10 eliminates or substantially reduces error caused by first order terms of source-drain resistance, and is limited only by second order terms.

The precision buffer circuit 10 is able to receive input voltage signals lower than those which could be handled by previously developed designs.

The following table shows typical performance of the precision buffer circuit 10 compared to that of a buffer circuit according to a previously developed design (with both buffer circuits compensated to produce the same 9.5% overshoot).

| Circuit | Open Loop Gain | Phase Margin | Linearity Error No load | Linearity Error 1k Ω load | Rise Time | −3 dB BW | Peaking |
|---|---|---|---|---|---|---|---|
| Previously developed buffer | 30 dB | 49.9° | 800 µV | 1500 µV | 392 ps | 833 MHz | 0.5 dB |
| High precision buffer | 58 dB | 48.4° | 30 µV | 231 µV | 325 ps | 1014 MHz | 0.5 dB |

The high precision buffer circuit 10 provides various advantages compared to previously developed designs. The high precision buffer circuit 10 has higher bandwidth. This is accomplished in some embodiments with circuitry that consumes the same amount of current and uses the same number and size of transistors as previously designs. Furthermore, the precision buffer circuit 10 of FIG. 1 has a higher open loop gain. This allows for better linearity—i.e., distortion is significantly reduced or eliminated relative to previously developed designs, as shown in the following table. For this table, all measurements were made at an output amplitude of 2 Vpp, 1k ohm load, 2 Vdc center. For this example, the output devices in both the high precision buffer circuit 10 and the buffer circuit according to previously developed design were increased by a multiple of 15 as a ready optimization of distortion. Bias currents were unchanged.

| Circuit | Second Harmonic Distortion for less than 1 MHz | Third Harmonic Distortion for less than 1 MHz | Second Harmonic Distortion, 10 MHz | Third Harmonic Distortion, 10 MHz |
|---|---|---|---|---|
| Previously developed buffer | −51.7 dBc | −64.6 dBc | −48.8 dBc | −57.3 dBc |
| High precision buffer | −80.1 dBc | −78.6 dBc | −56.2 dBc | −67.7 dBc |

Thus, the high precision buffer circuit 10 provides for a significant reduction at a given bias level, thus making it useful for applications such as portable consumer devices containing audio and video amplifiers in which both power and distortion (linearity) parameters are important to design.

Figure 2:
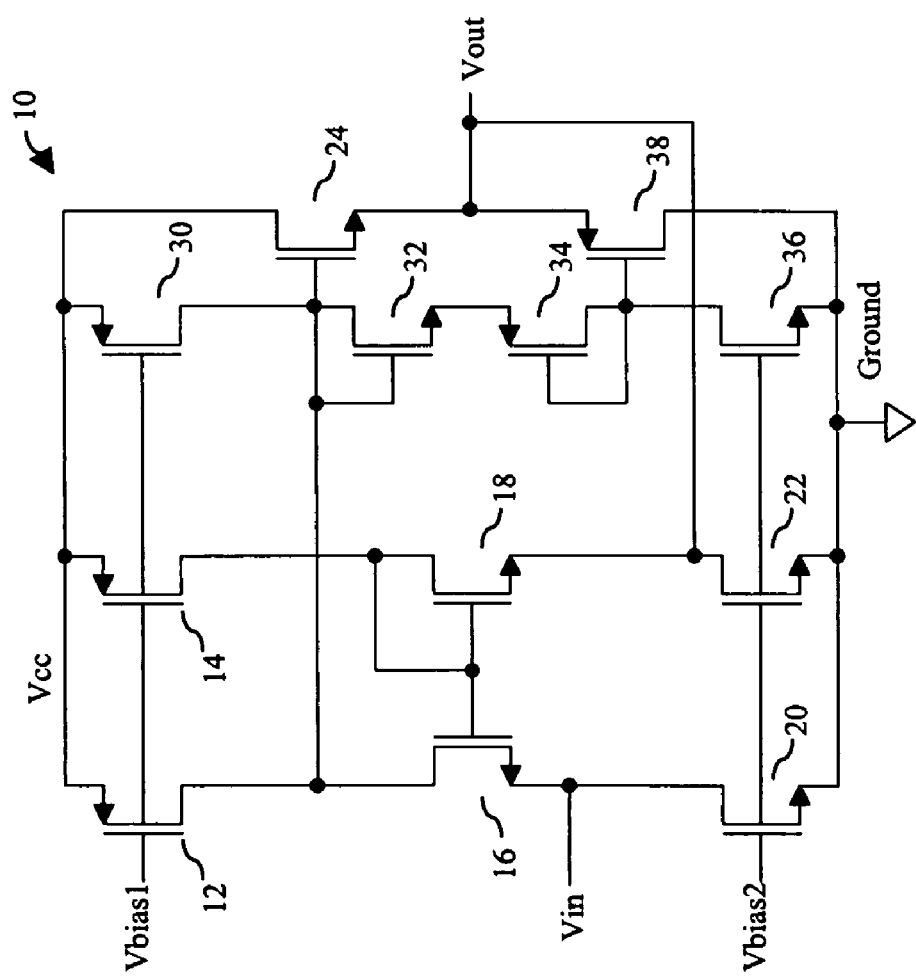
FIG. 2 is a schematic diagram of another implementation for a high-precision buffer circuit, according to an embodiment of the present invention.

FIG. 2 is a schematic diagram of another implementation for a high-precision buffer circuit 10, according to an embodiment of the present invention. This implementation includes transistors 30, 32, 34, 36, and 38 which can be implemented with any suitable transistor devices, such as MOSFETs (NMOS or PMOS) or BJTs. As depicted, transistors 30, 34, and 38 can be implemented as PMOS transistors, and transistors 32 and 36 can be implemented as NMOS transistors.

In many respects, the implementation depicted in FIG. 2 operates in the same way as the implementation depicted and described with reference to FIG. 1. When operating, precision buffer circuit 10 is designed to balance transistors 16 and 18, and most transistors are kept out of active operation. This provides for faster performance and less error.

Furthermore, in this implementation shown in FIG. 2, current to the output terminal can be sunk as well as sourced. In particular, transistor 38 sinks current, thus providing pull-down capability for the output terminal. Transistor 24 sources current, thus providing pull-up capability.

Figure 3:
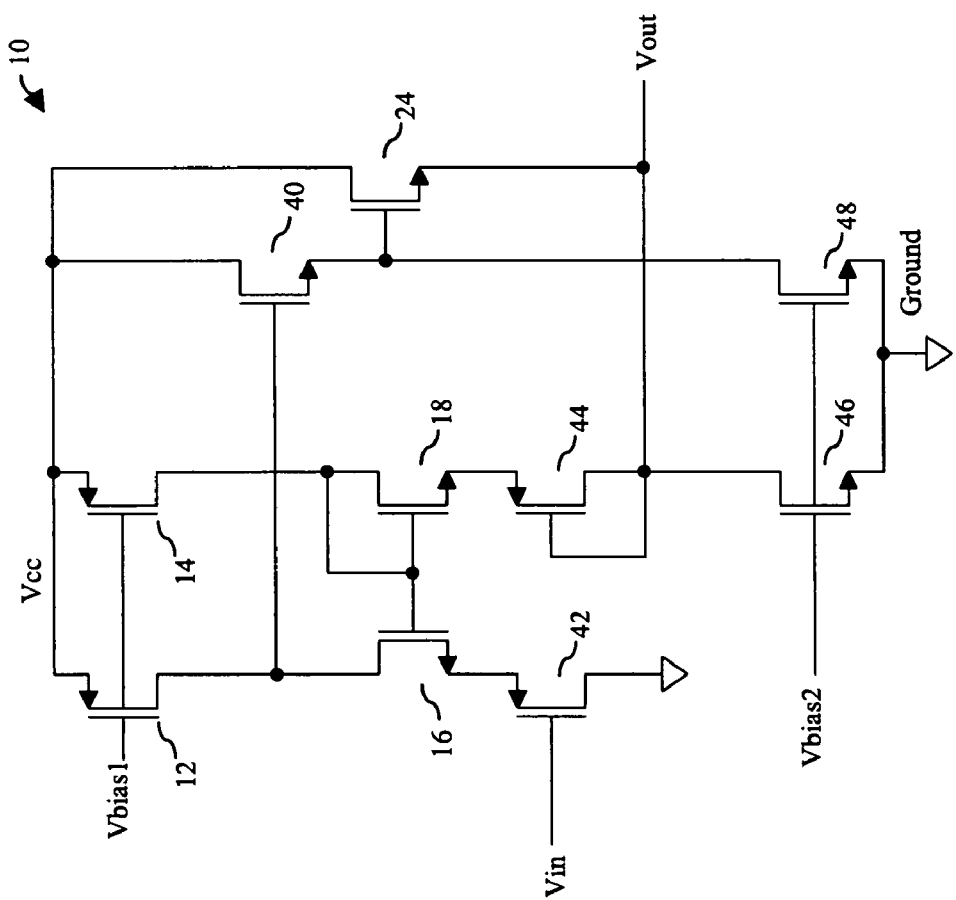
FIG. 3 is a schematic diagram of yet another implementation for a high-precision buffer circuit, according to an embodiment of the present invention.

FIG. 3 is a schematic diagram of yet another implementation for a high-precision buffer circuit 10, according to an embodiment of the present invention. This implementation includes transistors 40, 42, 44, 46, and 48 which can be implemented with any suitable transistor devices, such as MOSFETs (NMOS or PMOS) or BJTs. As depicted, transistors 40, 46, and 48 can be implemented as NMOS transistors, and transistors 42 and 44 can be implemented as PMOS transistors.

With this implementation, the input terminal of the high precision buffer circuit 10 appears at the gate of transistor 42, which is connected at its source to the source of transistor 16. The output terminal of the circuit is connected to the gate of transistor 44, which is connected at its source to the source of transistor 18. Transistor 24 follows transistor 40.

In operation, assuming an initial steady state for the implementation of precision buffer circuit 10 depicted in FIG. 3, an increase or rise in the input signal Vin at the input terminal (within a given operational range of slew rate ($\Delta V/\Delta t$) causes less current to flow through transistor 42. The voltage at the source of transistor 16 increases. As such, the gate-source voltage Vgs of transistor 16 decreases. Accordingly, less current flows through transistor 16. This causes the voltage at the gate of transistor 40 to increase, and thus, more current flows through transistor 40. Transistor 24 follows transistor 40. This pulls up the voltage at the output terminal. Thus, the output signal Vout increases in response to an increase in the input signal Vin. Transistor 14 sources current for transistor 18, and thus transistor 18 may have a relatively fixed gate-source voltage Vgs. The increased voltage at the output terminal causes less current to flow through transistor 44. Thus, the voltage at the sources of transistors 44 and 18 increases. This causes the gate voltages Vg of transistors 18 and 16 to increase. In turn, gate-source voltages Vgs of transistors 16 and 42 increase. Thus, transistors 16 and 18, and also transistors 42 and 44, are brought into balance again for steady state.

Alternatively, again assuming an initial steady state for precision buffer circuit 10 as implemented in FIG. 3, a decrease or drop in the input signal Vin at the input terminal (within a given operational range of $\Delta V/\Delta t$) causes more current to flow through transistor 42. The voltage at the source of transistor 16 decreases. This causes gate-source voltage Vgs of transistor 16 to increase. Accordingly, more current flows through transistor 16. This causes the voltage at the gate of transistor 40 to decrease, and thus, less current flows through transistor 40. Transistor 24 follows transistor 40. The voltage at the output terminal decreases. Thus, the output signal Vout decreases in response to a decrease in the input signal Vin. The decreased voltage at the output terminal causes more current to flow through transistor 44. Thus, the voltage at the sources of transistors 44 and 18 decreases. This causes the gate voltages Vg of transistors 18 and 16 to decrease. In turn, gate-source voltages Vgs of transistors 16 and 42 decrease. Thus, transistors 16 and 18, and also transistors 42 and 44, are brought into balance again for steady state.

Figure 4:
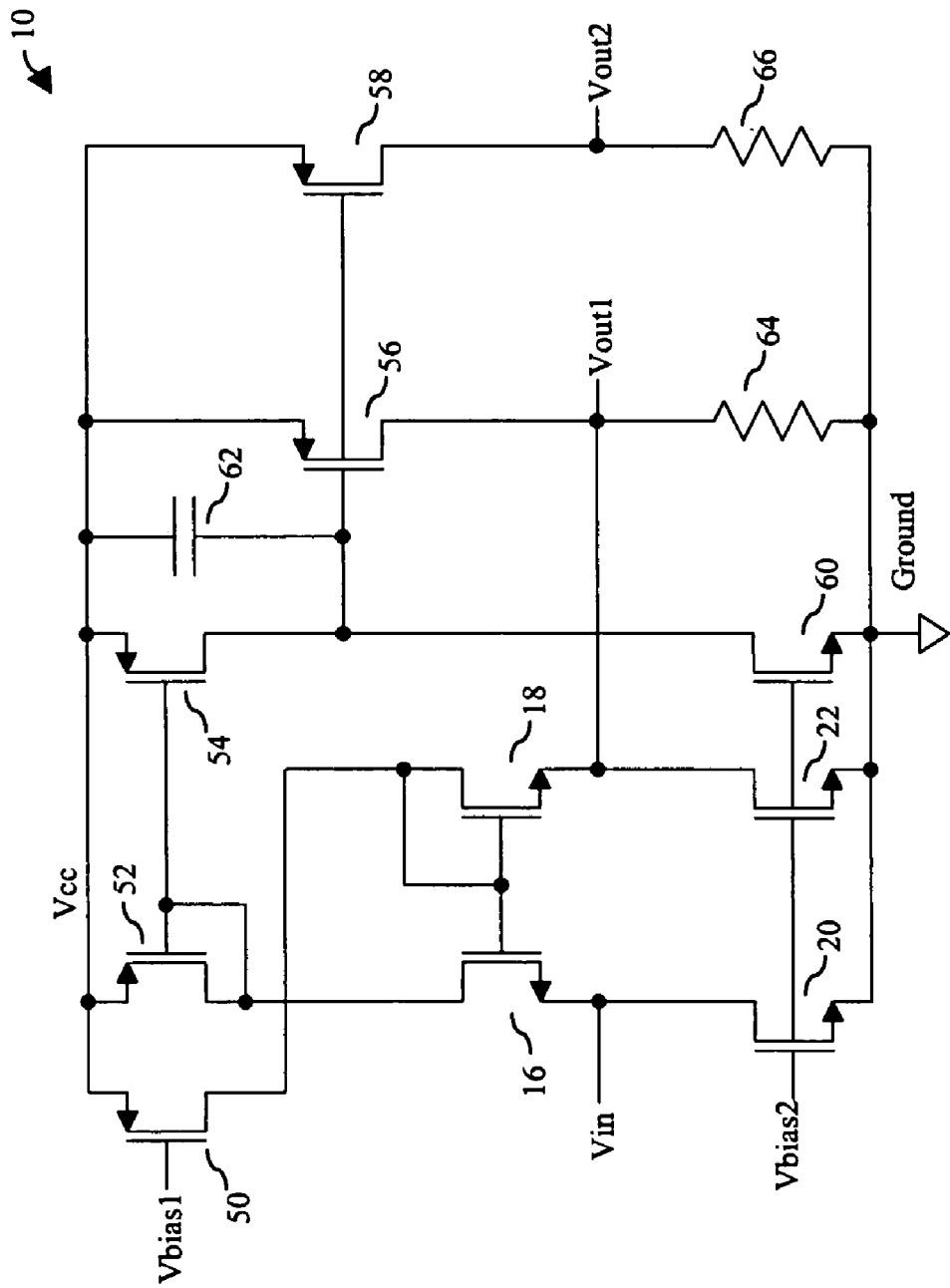
FIG. 4 is a schematic diagram of still yet another implementation for a high-precision buffer circuit, according to an embodiment of the present invention.

FIG. 4 is a schematic diagram of still yet another implementation for a high-precision buffer circuit 10, according to an embodiment of the present invention. This implementation includes transistors 50, 52, 54, 56, 58, and 60, capacitor 62, and resistors 64 and 66. Transistors 50, 52, 54, 56, 58, and 60 can be implemented with any suitable transistor devices, such as MOSFETs (NMOS or PMOS) or BJTs. As depicted, transistors 50, 52, 54, 56, and 58 can be implemented as PMOS transistors, and transistor 60 can be implemented as NMOS transistor.

In this embodiment, system 10 has two output terminals for respective output signals Vout1 and Vout2. The output signal Vout1 is fed back to transistor 18, similar to the operation of the embodiment shown and described with reference to FIG. 1. Transistors 52 and 54 form a current mirror. As such, the current flowing in transistor 52 (which is also the current flowing in transistor 16) is mirrored by transistor 54. In this implementation, the connection between the drains of transistors 54 and 60 is the high gain node for the circuit. The voltage at this high gain node drives the gate of transistors 56 and 58, with their currents flowing into resistors 64 and 66 respectively. The output signals Vout1 and Vout2 appear at the drains of transistors 56 and 58.

The signal at the Vout1 terminal is fed back to the input in a manner similar to that for the embodiment shown and described with reference to FIG. 1. With this feedback, the current flowing in transistor 56 is adjusted to bring transistors 16 and 18 into balance. If transistors 56 and 58 are implemented to match, transistor 58 mimics the current flowing in transistor 56, including feedback correction of errors. This provides an error corrected current output at Vout2 terminal without feedback. This can be useful, for example, in driving a capacitive load from the Vout2 terminal. If a capacitive load were placed on the Vout1 terminal, it would introduce additional delay in the feedback signal causing potential instability.

The implementation in FIG. 4 may also be useful as a single output amplifier (i.e., without transistor 58, resistor 66, and Vout2 terminal).

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A buffer circuit comprising:
   an input terminal operable to receive an input signal;
   an output terminal at which an output signal for the buffer circuit is provided;
   a first transistor having a gate, a source, and a drain, wherein the source of the first transistor is connected to the input terminal;
   a second transistor having a gate, a source, and a drain, wherein the gate of the first transistor is connected to the drain and the gate of the second transistor, wherein the source of the second transistor is connected to the output terminal;
   a third transistor having a gate, a source, and a drain, wherein the gate of the third transistor is connected to the drain of the first transistor, wherein the source of the third transistor is connected to the output terminal and to the source of the second transistor;
   a first current source connected to the drain of the first transistor; and
   a second current source connected to the drain of the second transistor.

2. The buffer circuit of claim 1 wherein each of the first and second current sources comprises a respective transistor having a gate biased by a first bias signal so that the transistor is providing substantially constant current.

3. The buffer circuit of claim 2 wherein the transistors of the first and second current sources are matched so that any change in a drain-source voltage for one of the transistor of the first and second current sources is offset by a corresponding change in a drain-source voltage of the other transistor of the first and second current sources.

4. The buffer circuit of claim 1 comprising:
   a third current source connected to the source of the first transistor; and
   a fourth current source connected to the source of the second transistor.

5. The buffer circuit of claim 4 wherein each of the third and fourth current sources comprises a respective transistor having a gate biased by a second bias signal so that the transistor is in saturation.

6. The buffer circuit of claim 1 wherein the first transistor and the second transistor are balanced when a change occurs in the input signal appearing at the input terminal.

7. A buffer circuit comprising:
   an input terminal operable to receive an input signal;
   an output terminal at which an output signal for the buffer circuit is provided;
   a first transistor having a gate, a source, and a drain, wherein the source of the first transistor is connected to the input terminal;
   a second transistor having a gate, a source, and a drain, wherein the gate of the first transistor is connected to the drain and the gate of the second transistor, wherein the source of the second transistor is connected to the output terminal;
   a third transistor having a gate, a source, and a drain, wherein the gate of the third transistor is connected to the drain of the first transistor, wherein the source of the third transistor is connected to the output terminal and to the source of the second transistor;
   a fourth transistor having a gate, a source, and a drain, wherein the drain of the fourth transistor is connected to the drain of the first transistor;
   a fifth transistor having a gate, a source, and a drain, wherein the drain of the fifth transistor is connected to the drain of the second transistor;
   wherein the gates of the fourth and fifth transistors are biased by a first bias signal; and
   wherein the fourth and fifth transistors are matched so that the same amount of current flows through each of the fourth and fifth transistors.

8. The buffer circuit of claim 7 comprising:
   a sixth transistor having a gate, a source, and a drain, wherein the drain of the sixth transistor is connected to the source of the first transistor;
   a seventh transistor having a gate, a source, and a drain, wherein the drain of the seventh transistor is connected to the source of the second transistor;
   wherein the gates of the sixth and seventh transistors are biased by a second bias signal; and
   wherein the sixth and seventh transistors are matched so that the same amount of current flows through each of the sixth and seventh transistors.

9. The buffer circuit of claim 7 wherein the first transistor and the second transistor are balanced when a change occurs in the input signal appearing at the input terminal.

10. A buffer circuit comprising:
    an input terminal operable to receive an input signal;
    an output terminal at which an output signal for the buffer circuit is provided;

a first transistor and a second transistor, each of the first and second transistors having a gate, a source, and a drain, wherein the source of the first transistor is connected to the input terminal, wherein the gate of the first transistor is connected to the drain and the gate of the second transistor, wherein the source of the second transistor is connected to the output terminal;

a third transistor having a gate, a source, and a drain, wherein the gate of the third transistor is connected to the drain of the first transistor, wherein the source of the third transistor is connected to the output terminal and to the source of the second transistor;

a fourth transistor and a fifth transistor, each of the fourth and fifth transistors having a gate, a source, and a drain, wherein the drain of the fourth transistor is connected to the drain of the first transistor, wherein the drain of the fifth transistor is connected to the drain of the second transistor, wherein the gates of the fourth and fifth transistors are biased by a first bias signal, a sixth transistor and a seventh transistor, each of the sixth and seventh transistors having a gate, a source, and a drain, wherein the drain of the sixth transistor is connected to the source of the first transistor, wherein the drain of the seventh transistor is connected to the source of the second transistor, wherein the gates of the sixth and seventh transistors are biased by a second bias signal; and wherein only the first and third transistors are in active operation.

11. The buffer circuit of claim 10 wherein the fourth and the fifth transistors provide substantially constant current.

12. The buffer circuit of claim 10 wherein the sixth and the seventh transistors provide substantially constant current.

13. The buffer circuit of claim 10 wherein each of the fourth, fifth, sixth, and seventh transistors are providing substantially constant current.

14. The buffer circuit of claim 10 wherein the fourth and fifth transistors are matched.

15. The buffer circuit of claim 10 wherein the sixth and seventh transistors are matched.

16. The buffer circuit of claim 10 comprising a capacitor connected to the gate of the third transistor.

17. The buffer circuit of claim 10 wherein the first transistor and the second transistor are balanced when a change occurs in the input signal appearing at the input terminal.

18. A buffer circuit comprising:

an input terminal operable to receive an input signal;

an output terminal at which an output signal for the buffer circuit is provided;

a first transistor having a gate, a source, and a drain, wherein the source of the first transistor is connected to the input terminal;

a second transistor having a gate, a source, and a drain, wherein the gate of the first transistor is connected to the drain and the gate of the second transistor, wherein the source of the second transistor is connected to the output terminal;

a third transistor having a gate, a source, and a drain, wherein the gate of the third transistor is connected to the drain of the first transistor, wherein the source of the third transistor is connected to the output terminal and to the source of the second transistor; and a capacitor connected to the gate of the third transistor.

19. The buffer circuit of claim 18 wherein the first transistor and the second transistor are balanced when a change occurs in the input signal appearing at the input terminal.

20. A buffer circuit comprising:

an input terminal operable to receive an input signal;

an output terminal at which an output signal for the buffer circuit is provided;

a first transistor having a gate, a source, and a drain, wherein the source of the first transistor is directly connected to the input terminal;

a second transistor having a gate, a source, and a drain, wherein the gate of the first transistor is connected to the drain and the gate of the second transistor;

a third transistor having a gate, a source, and a drain, wherein the gate of the third transistor is connected to the drain of the first transistor, wherein the source of the third transistor is connected to the output terminal and to the source of the second transistor; and wherein the output signal is fed back to the first transistor and the second transistor to counter any change that occurs in the input signal appearing at the input terminal.

* * * * *